(12) United States Patent
Vasoya

(10) Patent No.: US 7,301,105 B2
(45) Date of Patent: Nov. 27, 2007

(54) PRINTED WIRING BOARDS POSSESSING REGIONS WITH DIFFERENT COEFFICIENTS OF THERMAL EXPANSION

(75) Inventor: Kalu K. Vasoya, Placentia, CA (US)

(73) Assignee: Stablcor, Inc., Costa Mesa, CA (US)

( * ) Notice: Subject to any disclaimer, the term of this patent is extended or adjusted under 35 U.S.C. 154(b) by 102 days.

(21) Appl. No.: 11/214,690

(22) Filed: Aug. 29, 2005

(65) Prior Publication Data
US 2006/0063428 A1    Mar. 23, 2006

Related U.S. Application Data

(60) Provisional application No. 60/604,857, filed on Aug. 27, 2004.

(51) Int. Cl.
H05K 1/03 (2006.01)
H05K 1/00 (2006.01)
H05K 1/18 (2006.01)
H05K 7/00 (2006.01)

(52) U.S. Cl. ........................ 174/255; 361/748
(58) Field of Classification Search ................ 361/736, 361/748, 761, 792, 793, 794, 795; 174/260, 174/261, 262, 263, 267, 265, 266
See application file for complete search history.

(56) References Cited

U.S. PATENT DOCUMENTS

| 4,299,873 A | 11/1981 | Ogihara et al. |
| 4,318,954 A | 3/1982 | Jensen |
| 4,591,659 A | 5/1986 | Leibowitz |
| 4,689,110 A | 8/1987 | Leibowitz |
| 4,769,270 A | 9/1988 | Nagamatsu et al. |
| 4,792,646 A | 12/1988 | Enomoto |
| 4,812,792 A | 3/1989 | Leibowitz |
| 4,888,247 A | 12/1989 | Zweben et al. |
| 5,004,639 A | 4/1991 | Desai |
| 5,326,636 A | 7/1994 | Durand et al. |
| 5,354,599 A * | 10/1994 | McClanahan et al. ...... 428/209 |
| 5,382,505 A | 1/1995 | Schmidt et al. |
| 5,436,062 A | 7/1995 | Schmidt et al. |

(Continued)

FOREIGN PATENT DOCUMENTS

GB    2248725 A    4/1992

OTHER PUBLICATIONS

International Search Report dated Jan. 11, 2006 mailed Jan. 19, 2006 for Application No. PCT/US2005/030709 filed Aug. 29, 2005, 2 pgs.

(Continued)

*Primary Examiner*—Dean A. Reichard
*Assistant Examiner*—Sheldon Soon
(74) *Attorney, Agent, or Firm*—Kauth, Pomeroy, Peck & Bailey LLP

(57) ABSTRACT

Printed wiring boards are disclosed that include regions having different coefficients of thermal expansion. In one aspect of the invention, the regions can be matched to the coefficients of thermal expansion of devices mounted on the printed wiring board. In one embodiment, the invention includes a layer including a base material and at least one insert material that are combined using a resin. In addition, the base material and insert material are located within the same plane.

20 Claims, 12 Drawing Sheets

U.S. PATENT DOCUMENTS

| | | | |
|---|---|---|---|
| 5,527,838 A | 6/1996 | Afzali-Ardakani et al. | |
| 5,646,373 A | 7/1997 | Collins et al. | |
| 5,746,929 A | 5/1998 | Schmidt et al. | |
| 6,013,588 A | 1/2000 | Ozaki | |
| 6,016,598 A | 1/2000 | Middelman et al. | |
| 6,068,782 A * | 5/2000 | Brandt et al. | 216/17 |
| 6,207,904 B1 | 3/2001 | Kramer et al. | |
| 6,211,487 B1 * | 4/2001 | Hatakeyama et al. | 219/121.71 |
| 6,222,740 B1 | 4/2001 | Bovensiepen et al. | |
| 6,329,603 B1 * | 12/2001 | Japp et al. | 174/255 |
| 6,341,067 B1 * | 1/2002 | Conder | 361/719 |
| 6,373,000 B2 | 4/2002 | Nakamura et al. | |
| 6,426,470 B1 * | 7/2002 | Farquhar et al. | 174/266 |
| 6,486,394 B1 | 11/2002 | Schmidt et al. | |
| 6,541,865 B2 | 4/2003 | Hawker et al. | |
| 6,597,583 B1 * | 7/2003 | Sasaki | 361/761 |
| 6,639,155 B1 * | 10/2003 | Bupp et al. | 174/260 |
| 6,766,576 B2 * | 7/2004 | Haze et al. | 29/852 |
| 6,820,332 B2 * | 11/2004 | Japp et al. | 29/852 |
| 6,869,665 B2 | 3/2005 | Tani et al. | |
| 7,002,080 B2 | 2/2006 | Tani et al. | |
| 2002/0085360 A1 * | 7/2002 | Doi | 361/782 |
| 2004/0099364 A1 * | 5/2004 | Suzuki et al. | 156/89.11 |
| 2004/0130877 A1 * | 7/2004 | Okubora | 361/793 |
| 2004/0151882 A1 * | 8/2004 | Tani et al. | 428/209 |
| 2004/0165361 A1 * | 8/2004 | Kimura et al. | 361/763 |

OTHER PUBLICATIONS

Written Opinion dated Jan. 11, 2006 mailed Jan. 19, 2006 for Application No. PCT/US2005/030709 filed Aug. 29, 2005, 3 pgs.

Meier, Dr. Dieter J. and Agater, Michael, "Lasering Structuring of Fine Lines", posted Sep. 1, 2000, (7 pp.).

Dietz, Karl, "Fine Lines in High Yield (Part LXXX): Problems with Residual, Excess Copper in Print/Etch and Tent/Etch Processes (Part C)", Tech Talk, 2005, printout from Circuitree website by BNP Media; 5 pp.

Dyconex—Technologies & Products—Products—CTE Matched MLB, Oct. 4, 1997, printout from dyconex.com website, 3 pp.

"High-Performance DYCOstrate® MLBs", DYCONEX Advanced Circuitry Technology pamphlet; 11 pp., undated.

"Thermal Management of Electronics", The 5th International Business and Technology Summit, Aug. 17-18, 2005, Natick, MA, Show brochure and documents, ~465 pp. (2-sided).

* cited by examiner

PRINTED WIRING BOARDS POSSESSING REGIONS WITH DIFFERENT COEFFICIENTS OF THERMAL EXPANSION

CROSS-REFERENCE TO RELATED APPLICATIONS

This application claims the benefit of U.S. Provisional Patent Application Ser. No. 60/604,857 filed Aug. 27, 2004, the disclosure of which is incorporated herein by reference in its entirety.

BACKGROUND

The present invention generally relates to printed wiring boards and more specifically to printed wiring boards having localized regions with different coefficients of thermal expansion (CTEs).

Printed wiring boards can be used to establish electrical connections between devices. In some instances, the devices can be mounted on the printed wiring board. The manner in which the devices are mounted is typically dependent upon the packaging of the device. Examples of packages used for electronic devices include Dual Inline Packages, Small Outline Packages, Thin Small Outline Packages (TSOP), Plastic Packages, Leadless Ceramic Chip Carriers, Ceramic Packages, Ball Grid Array Packages (BGA), Pin Grid Arrays (PGA), Pad Array Carriers (PAC), Micro Ball Grid Arrays, Flip Chip Packages (FC), Chip Scale Packages (CSP) and Wafer Level Packaging (WLP).

Different package types can have significantly different CTEs. An important aspect of printed wiring board design is matching the CTE of the board to the CTE of the packaging of the electronic devices mounted on the printed wiring board. This design objective is often referred to as minimizing CTE mismatch between a printed wiring board and an electronic device's packaging. If mismatches occur, then thermal cycling can cause the electronic device to separate from the printed wiring board. U.S. Pat. No. 6,869,664 to Vasoya et al. and U.S. patent application Ser. No. 11/131,130 disclose techniques that can be used to manufacture printed wiring boards having a desired CTE. The disclosure of U.S. Pat. No. 6,869,664 and U.S. patent application Ser. No. 11/131,130 is incorporated herein by reference in its entirety.

SUMMARY OF THE INVENTION

Printed wiring boards and techniques for manufacturing printed wiring boards are disclosed. Embodiments of printed wiring boards in accordance with the present invention include localized regions possessing different physical characteristics. In several embodiments, a variety of electronic devices are mounted on the printed wiring board and each electronic device is mounted on a region of the printed wiring board having a CTE that is compatible with the packaging of that electronic device.

In one embodiment, the invention includes a base material and at least one insert material. In addition, at least one of the insert materials possesses different physical characteristics to the base material, the base and insert materials are located in the same plane and resin combines the base and insert materials to form a single layer.

In a further embodiment the layer formed by the base material, insert materials and the resin is clad on at least one side by a layer of electrically conductive material.

In another embodiment, the base material is non-dielectric. Furthermore, at least one of the insert materials is dielectric.

In a further embodiment again, at least one of the insert materials is non-dielectric.

In another embodiment again, the base material is dielectric. Furthermore, at least one of the insert materials is dielectric.

In a still further embodiment, at least one of the insert materials is non-dielectric.

In still another embodiment, the base material and at least one of the insert materials possess different coefficients of thermal expansion.

In a yet further embodiment, at least one of the insert materials is configured to form an electrical connection with the base material within the plane of the layer formed by the base material, insert materials and resin.

In yet another embodiment, no electrical connections exist between the base material and an insert material within the plane of the layer formed by the base material, insert materials and resin.

In a further additional embodiment, the resin is a dielectric resin.

In another additional embodiment, the resin includes additives and the resin, including the additives, is non-dielectric.

A still further embodiment again includes a layer including a base material and at least one insert material that are combined using a resin. In addition, the base material and insert material are located within the same plane.

In still another further embodiment again, the layer formed by the base material and the insert materials is clad on at least one side with a layer of electrically conductive material.

In a yet further embodiment again, the base material is a dielectric material. Furthermore, at least one of the insert materials is dielectric.

In yet another embodiment again, at least one of the insert materials is non-dielectric.

In an additional further embodiment again, at least one plated through hole passes through the non-dielectric insert material.

Another additional embodiment again also includes a layer of electrically conductive material separated from the layer formed by the base material, insert materials and resin by at least a dielectric layer. In addition, at least one of the plated through holes establishes an electrical connection between the non-dielectric insert material and the layer of electrically conductive material. Furthermore, at least one of the plated through holes passes through a dielectric filled clearance hole in the non-dielectric insert material.

In a still yet further embodiment, the resin is a dielectric resin.

In still yet another embodiment, the resin includes additives and the resin, including the additives, is non-dielectric.

In a still further additional embodiment, the base material is non-dielectric.

Still another additional embodiment also includes a layer of electrically conductive material separated from the layer formed by the base material, insert materials and resin by at least a dielectric layer and at least one plate through hole. In addition, a plated through hole establishes an electrical connection between the non-dielectric base material and the layer of electrically conductive material. Furthermore, at least one of the insert materials is dielectric.

In a yet further additional embodiment, at least one of the insert materials is non-dielectric.

In yet another additional embodiment, the resin is dielectric.

In a still yet further embodiment again, the resin includes additives and the resin, including the additives, is non-dielectric.

Still yet another embodiment again also includes at least one plated through hole that passes through the non-dielectric insert material.

A still further additional embodiment again also includes a layer of electrically conductive material separated from the layer formed by the base material, insert materials and resin by at least a dielectric layer. In addition, at least one of the plated through holes establishes an electrical connection between the non-dielectric insert material and the layer of electrically conductive material.

In still another additional embodiment again, at least one of the plated through holes passes through a dielectric filled clearance hole in the non-dielectric insert material.

An embodiment of the method of the invention includes removing at least one section of a base material, cutting at least one insert material to fit within at least one of the removed sections of the base material, arranging the insert materials within the removed sections of the base material on a layer including resin and laminating at least the base material, insert materials and layer including resin.

A further embodiment of the method of the invention also includes positioning a layer including resin below the base and insert materials and positioning another layer including resin above the base and insert materials.

Another embodiment of the method of the invention also includes drilling clearance holes through the laminate formed by at least the base material, insert material and layer including resin, forming a stack including the drilled laminate, at least one dielectric layer and at least one electrically conductive layer and laminating the stack.

A still further embodiment of the method of the invention also includes drilling holes in the laminated stack and plating the drilled holes.

In still another embodiment of the method of the invention, at least one of the holes is drilled so that it passes through one of the clearance holes drilled in the laminate.

In a yet further embodiment of the method of the invention, the base material and an insert material are arranged so that at least one edge of the insert material is located within 30 mil of an adjacent edge of the base material.

In yet another embodiment of the method of the invention, the base material and an insert material are arranged so that at least one edge of the insert material is located between 10 mil and 125 mil from an adjacent edge of the base material.

An additional further embodiment of the method of the invention also includes drilling clearance holes in the base material prior to lamination.

In another additional embodiment of the method of the invention, the base material is a B-stage material, at least one of the insert materials is a C-stage material and the glass transition temperature of the B-stage material is equal to or lower than the glass transition temperature of the C-stage material.

In a still further embodiment again of the method of the invention, the base material, insert materials and layer including resin are arranged as part of a stack including dielectric layers and layers of electrically conductive material prior to lamination. Furthermore, the base material can be drilled with clearance holes prior to lamination.

Still another embodiment again of the method of the invention also includes drilling holes in the laminated stack and plating the drilled holes with an electrically conductive material.

A yet further embodiment again of the method of the invention also includes mounting electronic devices on the printed wiring board.

DETAILED DESCRIPTION OF THE INVENTION

Turning now to the drawings, printed wiring boards including localized regions having different physical properties (such as CTE) are illustrated. Printed wiring boards in accordance with the present invention can be manufactured by taking a layer of base material possessing a first set of physical properties, removing a portion of that base material and inserting an insert material having a second set of physical properties where the portion of base material has been removed. The layer of base material and the insert material can then be combined using a resin capable of absorbing the various forces created in instances where the two materials expand and contract at different rates. In many embodiments, multiple insert materials possessing various physical properties are combined with a base material. In one embodiment, the insert materials can each possess a CTE that differs from that of the base material. Alternatively, at least one of the insert materials can have the same CTE as the base material and be combined to harness the insert material's other physical properties.

Figure 1:
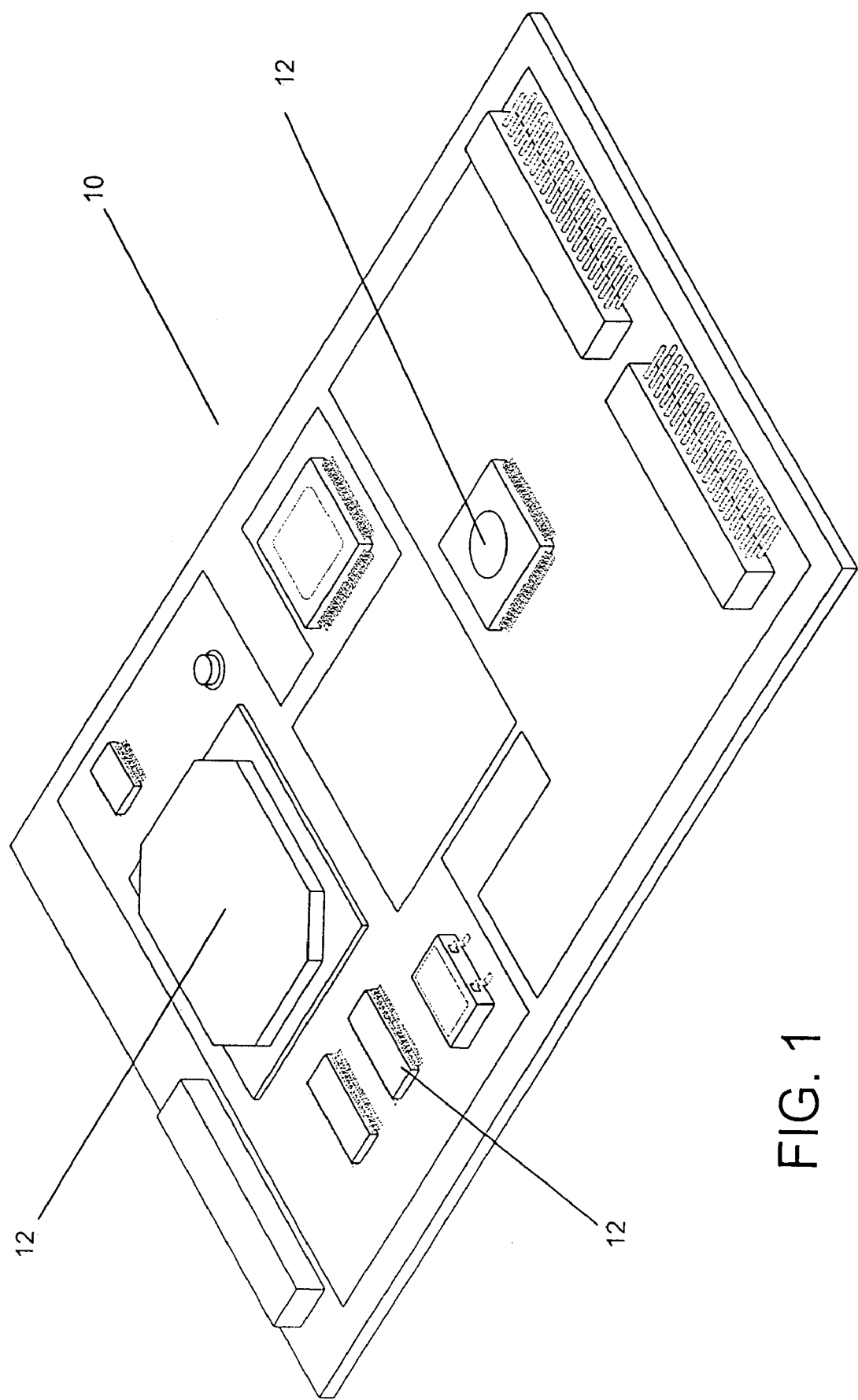
FIG. 1 is an isotropic view of a printed wiring board in accordance with an embodiment of the present invention on which a number of electronic devices possessing different types of packaging are mounted.

An embodiment of a printed wiring board in accordance with the present invention is illustrated in FIG. 1. The printed wiring board 10 includes a number of electronic devices 12 that are contained within different types of packaging. The printed wiring board includes regions possessing different CTEs. The location of the electronic devices on the printed wiring board is determined so that each electronic device is positioned above a region of the printed wiring board that has a CTE compatible with the CTE of the electronic device. Typically, the CTE of interest is the in-plane CTE of both the device packaging and the printed wiring board. The compatibility of the CTE of the packaging of an electronic device and the CTE of the region of the printed wiring board is largely dependent upon the operating requirements of the particular application in which the printed wiring board is intended for use.

Figure 2:
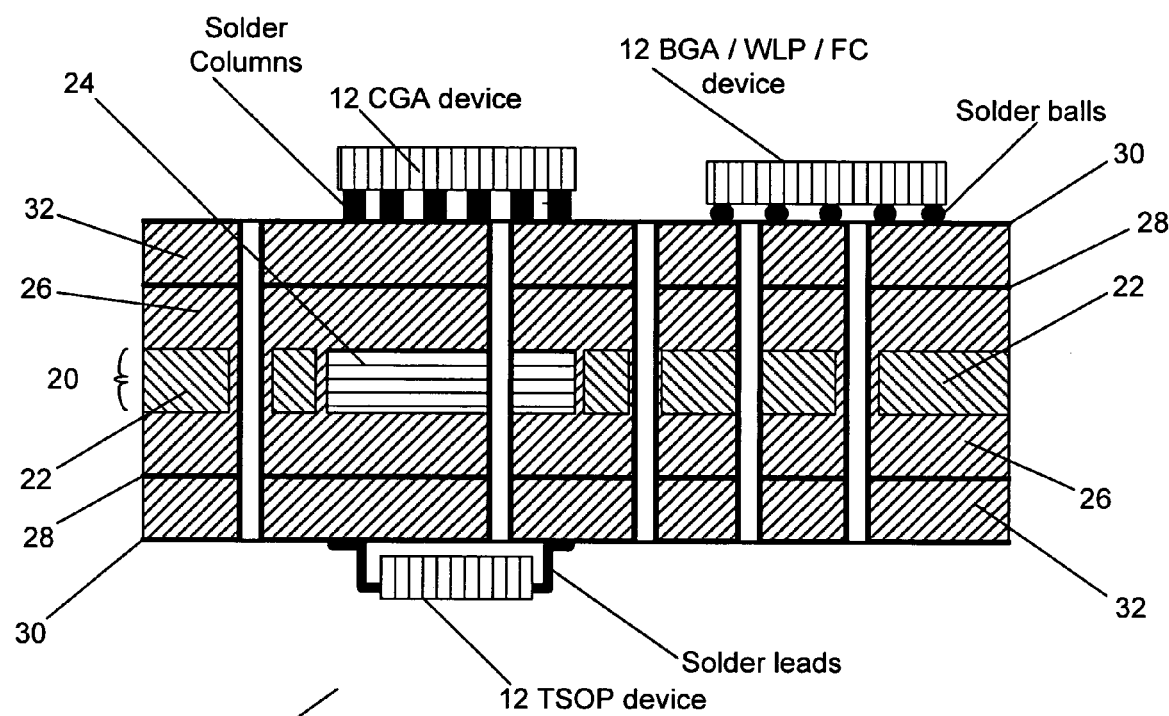
FIG. 2 is a schematic cross-sectional view of the printed wiring board shown in FIG. 1.

A cross section of the printed wiring board 10 shown in FIG. 1 is illustrated in FIG. 2. The printed wiring board 10 includes a number of functional and structural layers constructed from various materials. The functional layers of the printed wiring board are the layers that are intended to establish electrical connections between electronic devices and/or contain circuits that carry signals including reference voltages such as power or ground voltages. The structural layers of the printed wiring board are the layers that are not intended to establish connections between electronic devices and/or contain circuit traces carrying signals. The structural layers are included for their physical properties.

The printed wiring board 10 shown in FIG. 2 includes a layer 20 that can act as a structural layer, as a functional layer or as a structural layer in portions and a functional layer in other portions. The layer 20 includes regions that are constructed from different materials. The illustrated embodiment includes regions 22 that are constructed from a base material and at least one region 24 that is constructed from an insert material. In instances where there are multiple regions 24 constructed from insert materials, each of the insert materials can possess different physical properties. Selection of the base and insert materials enables customization of the physical properties of the layer 20. In many embodiments, a resin 26 or an equivalent thermosetting or thermoplastic material such as an adhesive is used to combine the regions into a single layer. The resin can provide structural support for the various regions of materials. In many embodiments, the resin also electrically insulates the layer 20 from adjacent layers of electrically conductive material 28. The remainder of the printed wiring board includes layers of electrically conductive material 30 that can form functional layers of the printed wiring board and that are separated from each other by layers of dielectric material 32.

As will be discussed further below, the techniques described herein can be used to combine almost any two types of material that can be used in the construction of a printed wiring board. The techniques described vary depending upon whether the base materials and insert materials are dielectric materials (i.e. effectively impede the flow of the type of electric signals found in a printed wiring board) or are non-dielectric materials (i.e. electrically conductive) and whether the resin 26 is dielectric or non-dielectric. The choice of base and insert materials can impact the physical properties of the printed wiring board. In instances where the insert materials 24 that form part of the layer 20 are constructed from materials having different sets of physical properties to those of the base material 22, the completed printed wiring board can possess regions with different physical properties. In many instances, the insert materials 24 are selected to provide regions of the printed wiring board with specific in-plane CTEs compatible with the in-plane CTEs of devices mounted on the printed wiring board.

In the embodiment illustrated in FIG. 2, the base material 22 is constructed from a non-dielectric material such as Carbon fiber impregnated with a resin such as EP 387 and EP450 manufactured by Lewcott Corporation of Millbury, Mass., the insert material 24 is constructed from a dielectric material such as E-glass impregnated with resin and the resin 26 combining the base and insert materials is a dielectric resin.

The Carbon fiber used as the base material in the embodiment shown in FIG. 2 is an example of a non-dielectric material suitable for use in the construction of printed wiring boards. Other examples of suitable non-dielectric materials include fibers coated in metal and impregnated with resin, solid carbon plates, Carbon-Silicon Carbide (C-SiC), such as the C-SiC manufactured by Starfire Systems Inc. of Malta, N.Y., Copper Invar Copper, Copper Molly Copper, Chemical Vapor Deposition (CVD) diamond, such as the CVD manufactured by Morgan Advanced Ceramics, Diamonex Products Division located at Allentown, Pa., Diamond, Diamond Like Carbon (DLC), Carbon composite and Graphite composite or a metal matrix composite. Each of these materials can be clad on at least one side.

When a non-dielectric material includes Carbon fibers, the fibers can be continuous, discontinuous, chopped or flakes. If discontinuous fibers are used, the fibers can be spin broken or stretch broken such as part no. X0219 manufactured by Toho Carbon Fibers Inc. of Rockwood, Tenn. In addition, the Carbon fiber can include PAN fibers and/or Pitch fibers.

Fibers that are suited to metal coating include Carbon, Graphite, Aramid, Kevlar, Quartz or any combinations of these fibers. Metals that can be used to coat fibers include Nickel, Copper, Palladium, Silver, Tin and Gold. Coating of fibrous material can be performed by manufacturers such as Electro Fiber Technologies located at Stratford, Conn.

The configurations in which fibrous materials can be arranged include being woven, unidirectional or non-woven mats. When the material is woven, the material can be in the form of a plain weave, twill weave, 2×2 twill, basket weave, leno weave, satin weave, stitched uni weave or 3D (Three dimensional) weave.

Fibrous materials can also be used in a non-woven form such as a Uni-tape or a mat. In many embodiments, carbon mats such as grade number 8000040 2 oz mat or 8000047 3 oz mat manufactured by Advanced Fiber NonWovens, East Walpole, Mass. are used in the construction of the region 22 constructed from a first material.

Carbon plates can be made using compressed carbon powder, carbon flakes or chopped carbon fiber.

In instances where the non-dielectric material includes a resin (e.g. when it is a resin impregnated substrate), the resin can be an Epoxy based resin, a Phenolic based resin, a Bismaleimide Triazine Epoxy (BT) based resin, a Cynate Ester based resin and/or a Polyimide based resin. The basic resin can also include fillers such as Pyrolytic Carbon powder, Carbon powder, Carbon particles, Diamond powder, Boron Nitride, Aluminum Oxide, Ceramic particles, and Phenolic particles to modify the electrical and/or physical properties of the base resin.

As discussed above, the insert material 24 shown in FIG. 2 is constructed from a dielectric material. Examples of other dielectric materials that can be used in the construction of a printed wiring board include Aramid, Kevlar, or any mixture of these fibrous materials.

In embodiments where the regions 24 constructed from a second material include resin, the resin can be an Epoxy based resin, an Bismaleimide Triazine Epoxy based resin, a Cynate Ester based resin and/or a Polyimide based resin. The resin system can also include fillers that modify the properties of the base resin.

In one embodiment, the resin 26 surrounding the regions 24 and 22 is constructed from thin E-glass, such as 106 style reinforced E-glass, that has a high resin content, high crack resistance and high toughness. In many embodiments, the resin can be Bismaleimide Triazine Epoxy based, an Epoxy Cynate Ester blend, Cynate Ester based, Polyimide based and/or PTFE based. The resin 26 can also include one or more additives that alter the base resin's physical properties. In many embodiments, the resin is capable of withstanding the forces associated with the thermal cycling of the various materials in the layer 20, which can have different CTEs. Suitable materials include 44N106, 84N106 B-stage materials manufactured by ARLON Electronic Material Division located at Rancho Cucamonga Calif., USA. Also 370HR106, 370 106 epoxy as well as PCL-GIP-785 polyimide 106 B-staged material manufactured by PolyClad Laminates located at Franklin N.H., USA. Also Laser Preg GI30 and 1080 manufactured by ISOLA Laminates located at Chandler Ariz., USA.

Many embodiments of printed wiring boards in accordance with the present invention include a layer 20 constructed using at least one or a combination of the dielectric and non-dielectric materials described above. The lists provided above are not exhaustive. The region 22 constructed from a base material and the regions 24 constructed from insert materials can be fabricated from virtually any material that can be used alone or in combination with other materials to create a laminate suitable for use in a printed wiring board. As discussed above, the choice of materials is typically influenced by the physical properties of the materials, including the resulting in-plane CTE of the region of the printed wiring board incorporating the material.

In one embodiment, the layers of electrically conductive material 28 and 30 can be constructed from Copper foils, manufactured by GOULD Electronics located at Eastlake Ohio, USA. Alternatively, the conductive material can be constructed from a resistive conductive foil such as the resistor-conductor materials manufactured by Ohmega Technologies, Inc. of Culver City, Calif. In other embodiments layers of electrically conductive material can be constructed by depositing copper by a chemical process such as the process used in depositing copper in plated through holes, resin coated copper (RCC), Nickel coated copper foil, Nickel-Gold coated copper foil and any other material that can be used in construction of the printed wiring board. In addition, the layers of electrically conductive material can be layers similar to the layer 20 provided at least part of the layer 20 acts as a functional layer.

In one embodiment, the dielectric layers 32 are constructed using E-glass reinforced with resin. In other embodiments, the dielectric layers can be constructed from an epoxy based material, Cynate Ester based material, Polyimide based material, GTek material, PTFE based material, an Aramid based material, chopped Kevlar based material, Kevlar based material, Quartz based material and any other material that can be used in construction of a dielectric layer in a printed wiring board.

Although many materials are listed above, the embodiments of the present invention are not restricted to the use of the above materials. Other materials can be used in combination with the manufacturing techniques described below to construct printed wiring boards in accordance with the present invention.

Figure 3:
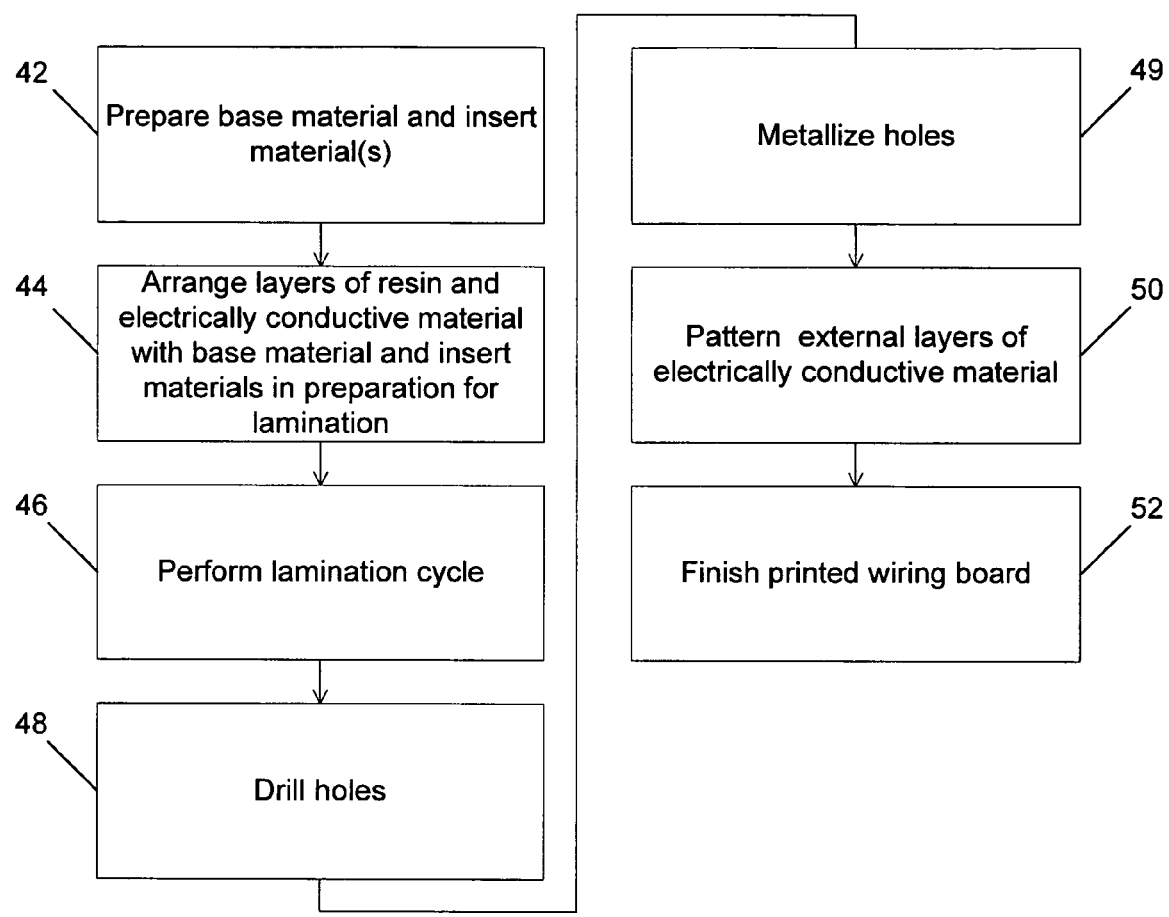
FIG. 3 is a flow chart illustrating a process for manufacturing a printed wiring board in accordance with an embodiment of the present invention from a base material and dielectric inserts.
Figure 5:
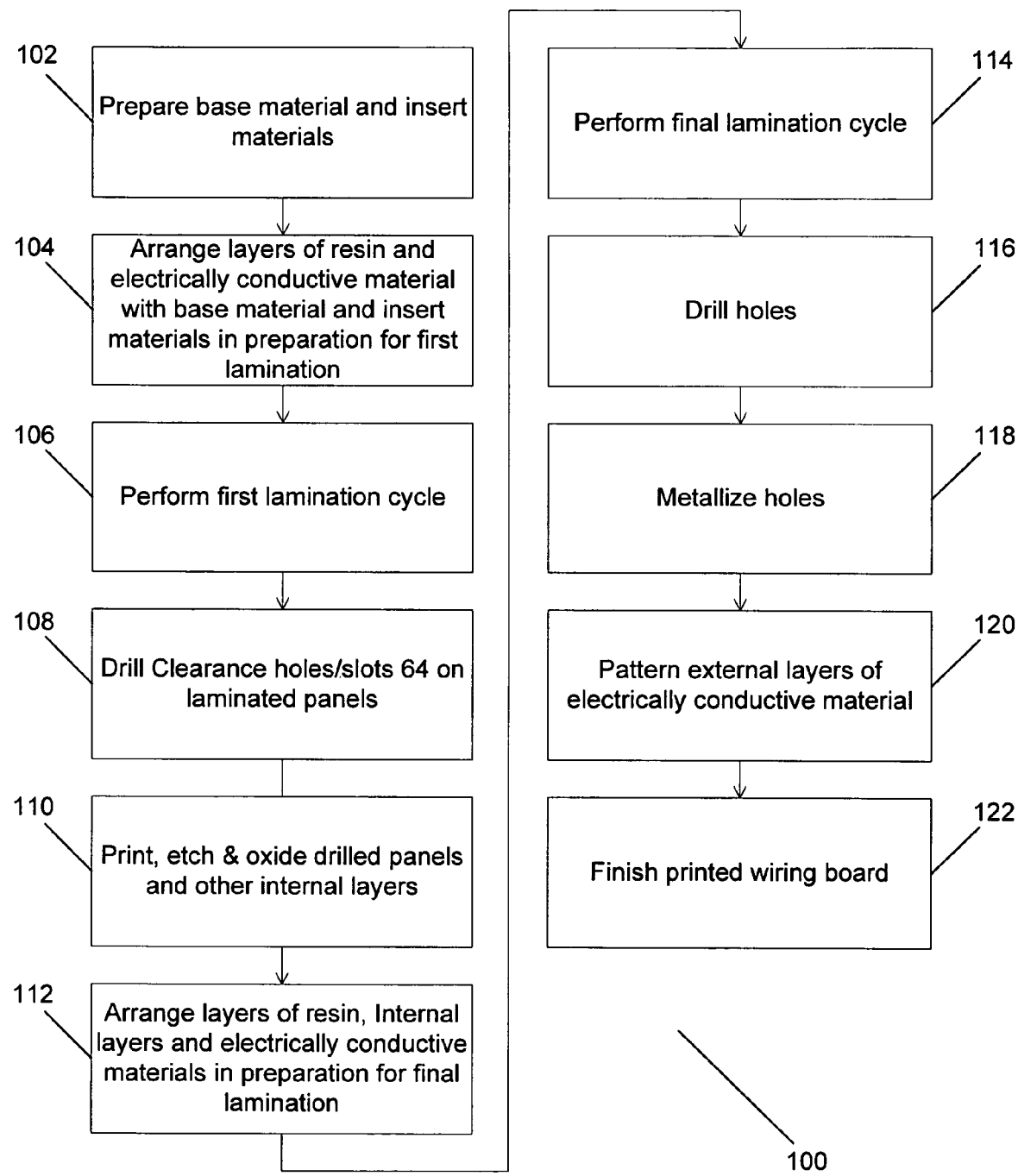
FIG. 5 is a flow chart illustrating a process for manufacturing a printed wiring board in accordance with an embodiment of the present invention from a base material and at least one non-dielectric (or electrically conductive) insert material.

The method used to construct a printed wiring board in accordance with the present invention is dependent upon the materials that are used to form the layer 20. The variation in the manufacturing processes relates to the electrical conductivity of the materials used in the construction of the printed wiring board. In many instances, a layer of a printed wiring board can be constructed by cutting out sections of a base material and substituting insert materials in the cut out sections. A first process that can be used in embodiments of the present invention where the insert materials used in the construction of the printed wiring board are all dielectric and the resin used to combine the base and insert materials is also dielectric is shown in FIG. 3. A second process that can be used in embodiments of the present invention, where at least one of the insert materials used in the construction of the printed wiring board is non-dielectric and/or the resin used to combine the base and insert materials is non-dielectric is shown in FIG. 5. Examples of embodiments of each type of process in accordance with the present invention are discussed below.

A method of constructing printed wiring boards in accordance with an embodiment of the present invention that involves using dielectric insert materials to create regions possessing physical properties differing from the properties of the remainder of the printed wiring boards is illustrated in FIG. 3. The method shown in FIG. 3 can be used to construct the embodiment of the printed wiring board illustrated in FIG. 2 and other embodiments where all of the insert materials and the resin used to combine the base and insert materials are dielectric. The method 40 involves preparing (42) a base material and insert materials. The preparation of the materials can include the removal of sections of the base material and the cutting of insert materials to fit the removed sections of base material. The prepared base and insert materials are then arranged (44) with dielectric layers and layers of electrically conductive material in preparation for lamination. The dielectric layers and layers of electrically conductive material can take the form of clad or unclad prepregs and laminates. A lamination cycle is then performed (46) to create a printed wiring board subassembly. Holes can be drilled (48) in portions of the printed wiring board subassembly and the linings of the holes plated (49) with electrically and/or thermally conductive material. The plated printed wiring board subassembly is printed and etched (50) to form a completed printed wiring board. The printed wiring board is then finished (52) and components can be mounted on the printed wiring board.

Materials and printed wiring board subassemblies that are utilized during the manufacturing process shown in FIG. 3 in accordance with an embodiment of the present invention are illustrated in FIGS. 4a-4h. As described above, the process for manufacturing printed wiring boards shown in FIG. 3 includes preparing a base material 60 and insert materials 62. These materials are the materials that are used to construct layers similar to the layer 20 shown in FIG. 2. The base material 60 is the material that makes up the majority of the layer 20.

In the illustrated embodiment, the base material 60 is non-dielectric and clad on both sides with layers of electrically conducting material such as copper. In other embodiments, the base material 60 can be dielectric and/or can be clad on one side or unclad. In embodiments where the base material is non-dielectric, the predrilling of the base material prior to lamination is typically unnecessary.

The base material can be prepared by drilling clearance holes 64 and cutting out sections 66. The drilled clearance holes are ultimately filled with resin and can electrically isolate the non-dielectric base material from conductive platings of vias drilled through the printed wiring board. The cut out sections ultimately define the regions of the completed printed wiring board that have physical properties (such as CTE), which differ from properties of other regions of the printed wiring board.

As discussed above, the insert material 62 is non-dielectric. Each of the insert materials is cut to a size that will fit within the appropriate cut out section 66 of the base material. Typically, the insert material is cut with dimensions that are slightly smaller than the cut out region. In one embodiment a gap 68 of 30 mil can be used. In other embodiments, the gap 68 can be a distance ranging from 10 mil to 125 mil. The gap 68 between the insert material 62 and the base material 60 typically is filled with bonding material such as an adhesive or resin.

As part of the manufacturing process, the prepared base and insert materials are arranged (44) with dielectric layers 70 and layers of electrically conductive material 72 in preparation for the lamination cycle. This process can be understood with reference to FIGS. 4c-4e. The materials are arranged by initially taking a laminate 74 clad on both sides with electrically conductive material 72 and stacking a first prepreg 76 on top of the clad laminate. Typically, the electrically conductive layer adjacent the prepreg is etched with circuit patterns. In the illustrated embodiment, the clad laminate 74 and the first prepreg 76 are manufactured using any of the well known manufacturing techniques employed by those of ordinary skill in the art.

Figure 4A:
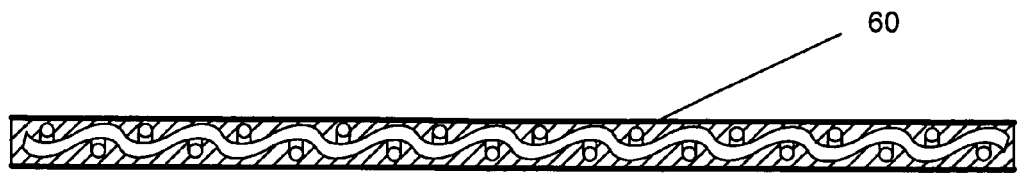
FIGS. 4a-4h are schematic cross-sectional views of various printed wiring board subassemblies that are constructed as part of the manufacturing process illustrated in FIG. 3.
Figure 4B:
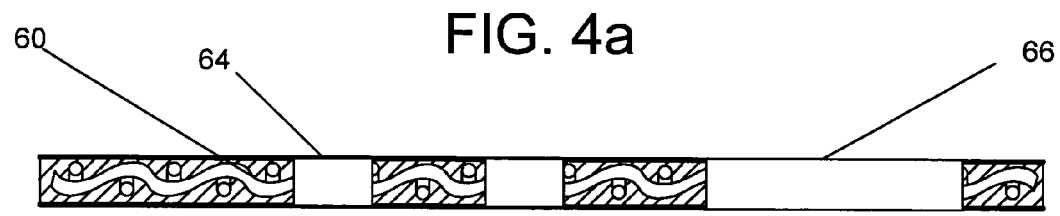
Figure 4C:
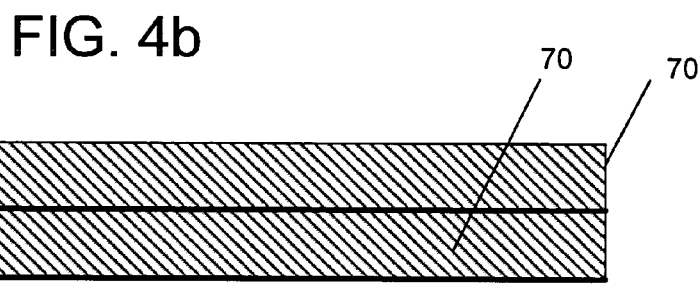
Figure 4D:
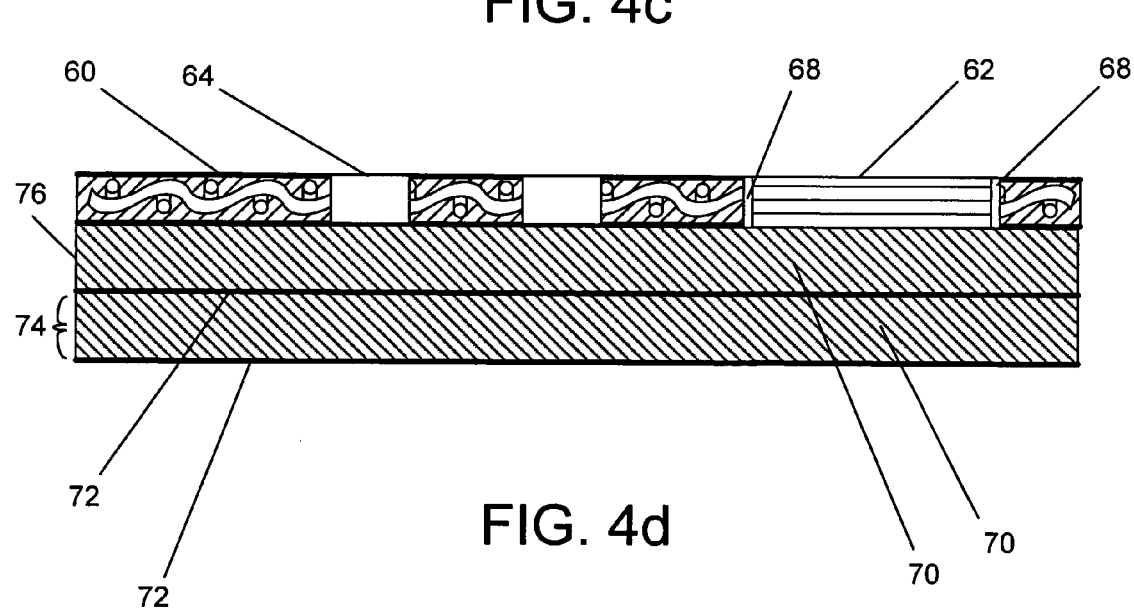
Figure 4E:
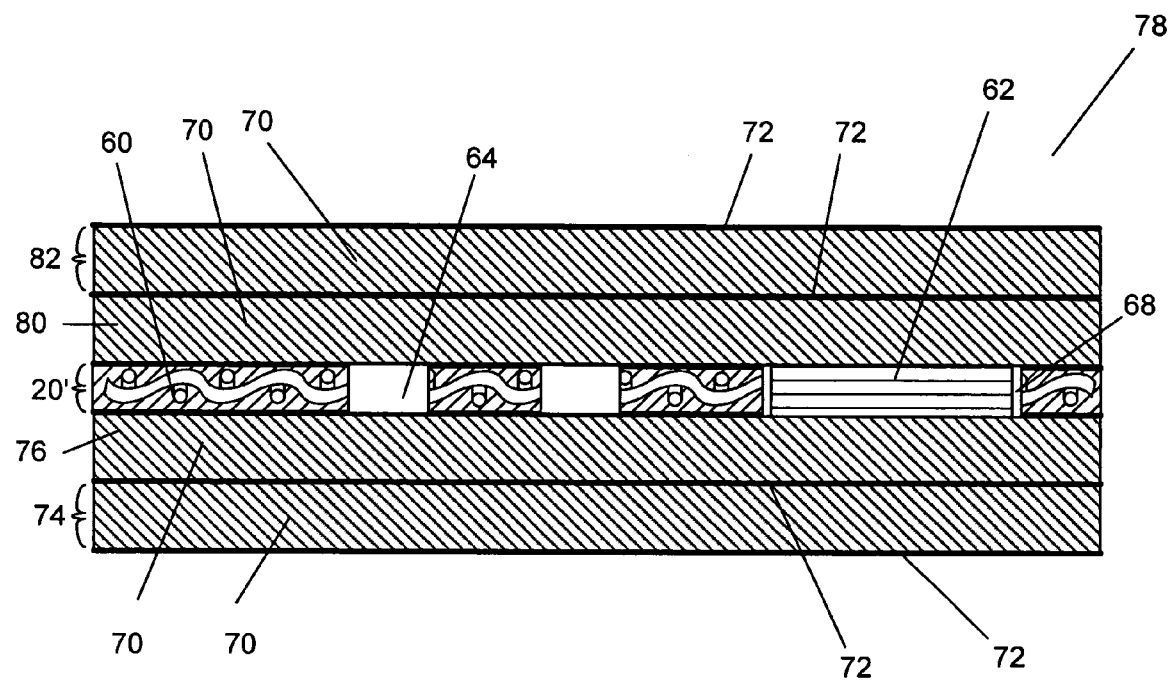

The base material 60 is then placed on top of the first prepreg 76. As discussed above, the base material can be prepared by drilling clearance holes 64 and creating cut out sections 66. The insert materials 62 are then placed in the cut out sections 66. The insert materials 62 are cut to leave a gap 68 with the base material 60 when they are inserted into the cut out sections 66. The arrangement 78 is completed by placing a second prepreg layer 80 on top of the layer formed by the base material 60 and the insert materials 62. A laminate clad on both sides with layers of electrically conductive material 82 is then placed on top of the second prepreg. The electrically conductive layer 82 adjacent the second prepreg can be pre-etched with circuit patterns. The resulting arrangement is illustrated in FIG. 4e. Although the illustrated embodiments include a prepreg and a laminate above and below the base material 60, other embodiments can include more than one patterned clad laminate and/or prepreg on either side of the base material 60 in order to form multiple functional layers. Indeed, a printed wiring board in accordance with the present invention can be constructed using two prepregs, each clad on one side, that are positioned above and below the layer formed by the base and insert materials. Furthermore, many embodiments include multiple layers formed by combining a base material with at least one insert material.

A lamination cycle is then performed (46). The nature of the lamination cycle is dependent upon the nature of the prepregs and dielectric layers used in the arrangement 78. Manufacturers of resins, prepregs and laminates specify the temperature and pressure conditions that are recommended during lamination. The lamination cycle can be performed by adhering to the manufacturer's recommendations for the various materials used in the construction of the printed wiring board.

Figure 4F:
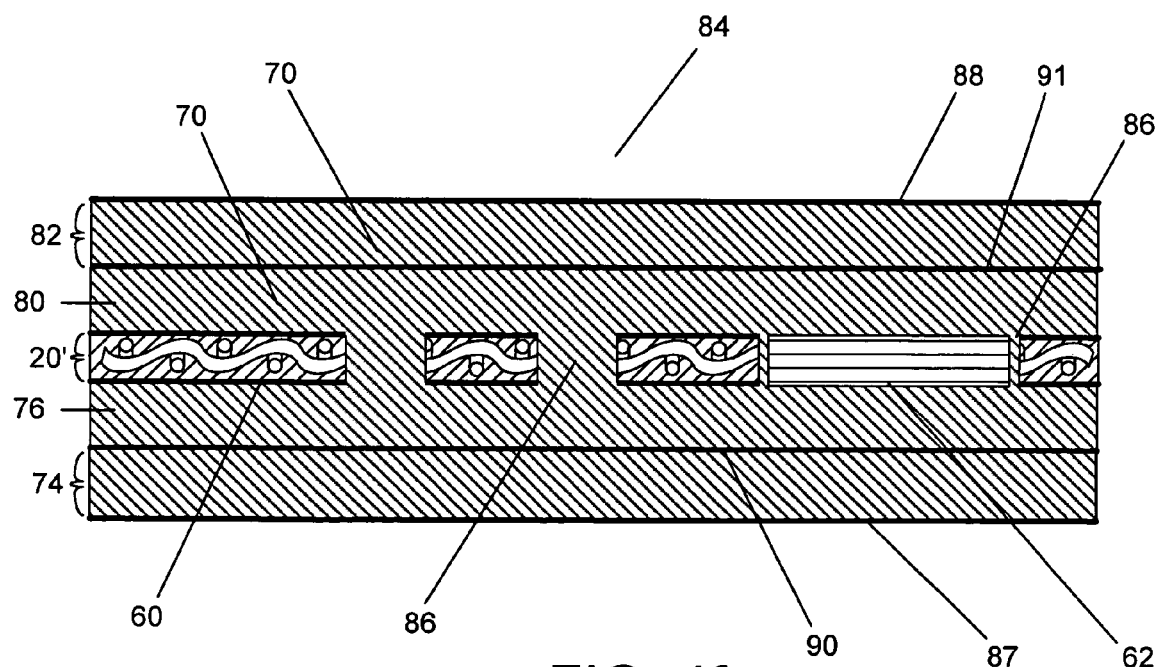

The lamination cycle produces the printed wiring board subassembly 84 in accordance with an embodiment of the present invention shown in FIG. 4f. As a result of the lamination cycle, resin 86 fills the gaps 68 between the base 60 and insert 62 materials and bonds them together. The resin 86 also fills the clearance holes 64 and bonds the layers of electrically conductive material 90 and 91 to the layer 20' formed by the base 60 and insert 62 materials.

Figure 4G:
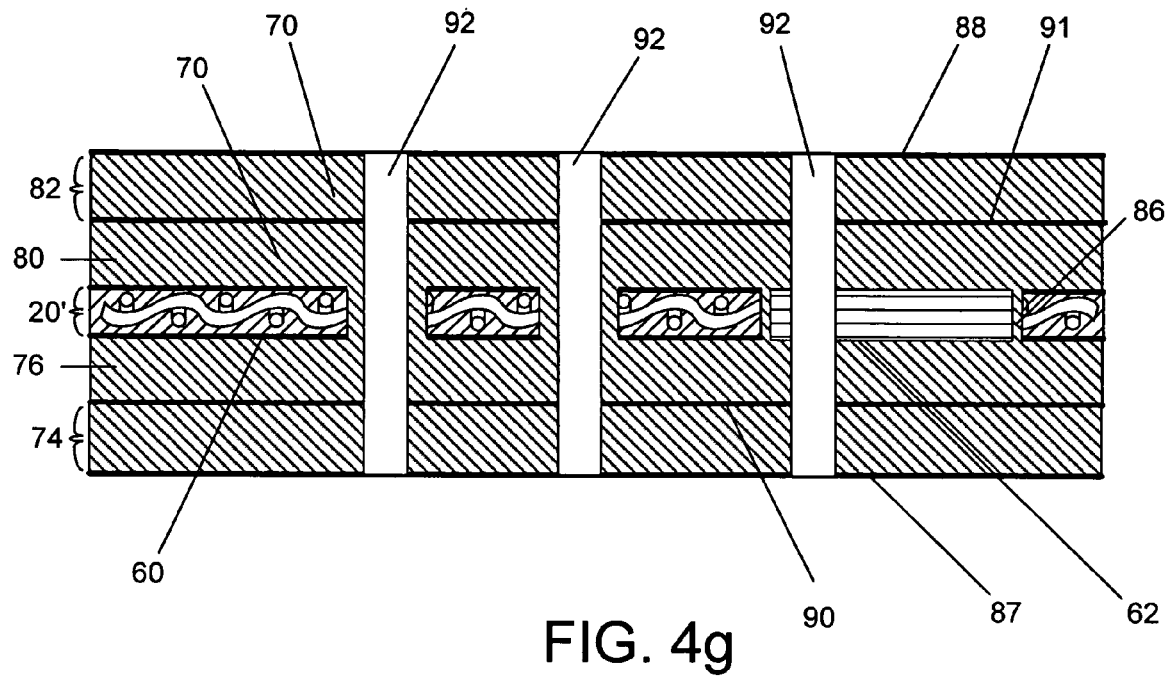
Figure 4H:
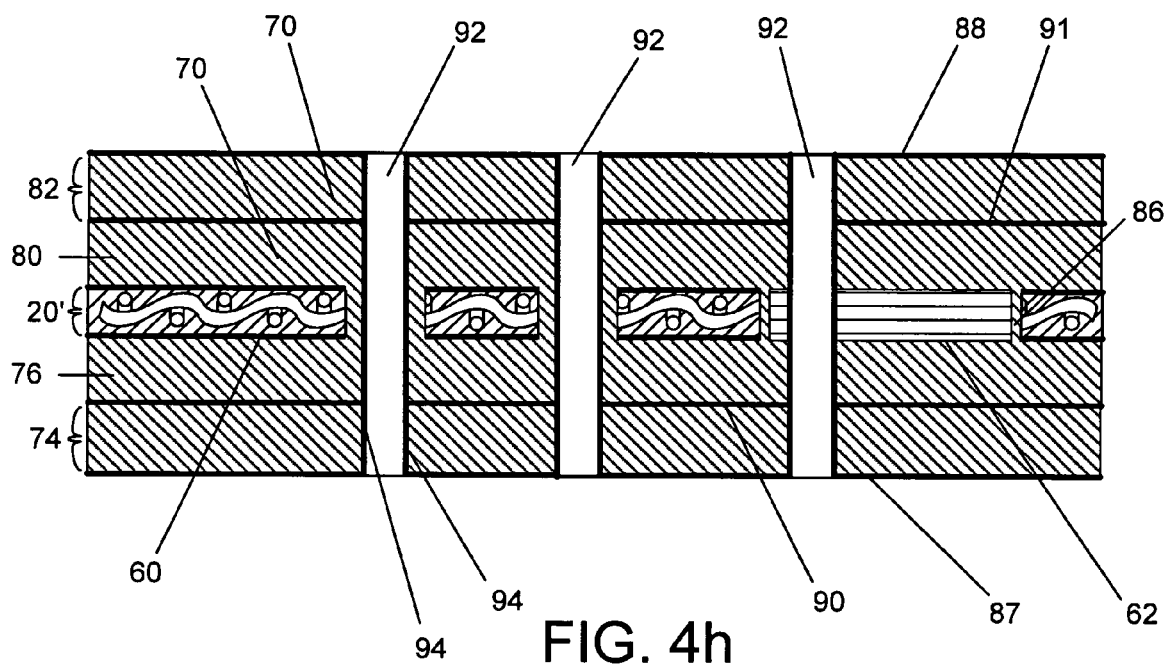

Through holes are drilled (48) in the printed wiring board subassembly. A drilled printed wiring board subassembly is shown in FIG. 4g. The printed wiring board subassembly includes a number of holes 92 that extend through each of the layers of the printed wiring board subassembly.

Once the holes have been drilled, the holes are plated (49) and the layers of electrically conductive material are printed and etched (50). These processes create circuits on and between the layers of the printed wiring board. As discussed above, the functional layers can include layers of electrically conductive material and regions of the layer 20'. The circuits created between the functional layers can be used to carry electrical signals. A completed printed wiring board (i.e. a printed wiring board to which electronic devices are connected or mounted) similar to the completed printed wiring board shown in FIG. 2 can be created by mounting electronic devices on the printed wiring board.

As discussed above, the method used to construct a printed wiring board in accordance with the present invention is dependent upon the materials that are used to form the layers of the printed wiring board. An embodiment of the method of the present invention that can be used where a layer of the printed wiring board includes a base material and at least one insert material that is non-dielectric and/or the resin used to combine the base and insert materials is non-dielectric is illustrated in FIG. 5. The process 100 includes preparing (102) a base material and insert materials. The prepared base material and insert materials are then arranged (104) with layers of resin and electrically conductive material in preparation for lamination. A first lamination cycle is then performed (106) to create a printed wiring board subassembly. Holes can then be drilled (108) through the printed wiring board subassembly to create clearance holes. The printed wiring board subassembly can then be printed, etched and oxided (110). The printed wiring board subassembly can then be arranged (112) with layers of resin and layers of electrically conductive material in preparation for a second lamination cycle. The second lamination cycler-formed (114) to produce a second printed wiring board subassembly. The second printed wiring board subassembly can have holes drilled (116) in it. The holes can be lined (118) with electrically and/or thermally conductive material. Once the holes are lined, the printed wiring board subassembly can be printed and etched (120) and the board finished (122).

Materials and printed wiring board subassemblies that are utilized during the manufacturing process shown in FIG. 5 are illustrated in FIGS. 6a-6k. As described above, the process for manufacturing printed wiring boards in accordance with the present invention illustrated in FIG. 5 includes preparing a base material 60' and insert materials 62'. These materials are the materials that are used to construct a layer similar to the layer 20 shown in FIG. 2. As in the method illustrated in FIG. 3, the base material makes up the majority of the layer 20 and is prepared by cutting out portions of material. These cut out portions 66' ultimately contain the insert materials 62', which define the portions of the completed wiring board that can have physical properties (such as CTE) differing from the physical properties of other regions of the board.

In the illustrated embodiment, the base material 60' can be either dielectric or non-dielectric and the insert material 62' is non-dielectric. Each of the insert materials is cut to a size that will fit within the appropriate cut out section 66' of the base material 60'. As discussed above, the insert materials are cut with dimensions that are slightly smaller than the cut out regions 66' and can have similar tolerances as those discussed in relation to FIGS. 3 and 4a-4h.

During manufacture, the prepared base and insert materials are arranged (104) with layers including resin. In many embodiments, the layers including resin are in the form of a prepreg. The prepregs can be substrates impregnated with a dielectric resin and/or resin films. Typically, the resin used in the prepregs is chosen to fill the cutout clearance around the insert materials during lamination.

Figure 6A:
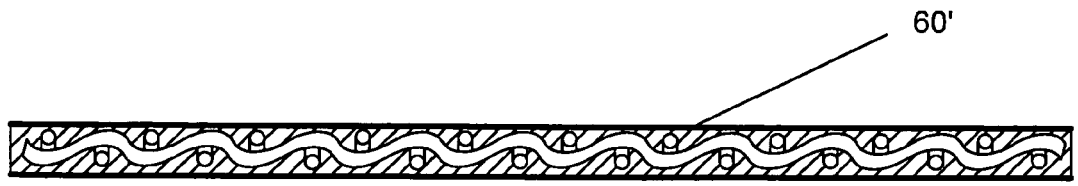
FIGS. 6a-6k are schematic cross-sectional views of various printed wiring board subassemblies that are constructed as part of the manufacturing process illustrated in FIG. 5.
Figure 6B:
Figure 6C:
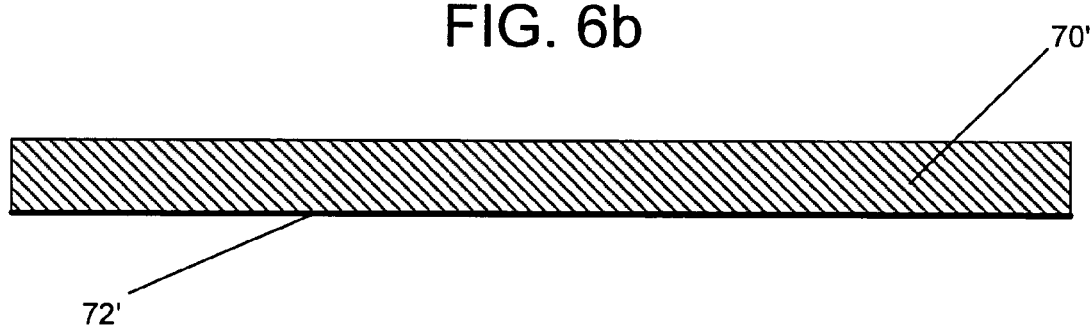
Figure 6D:
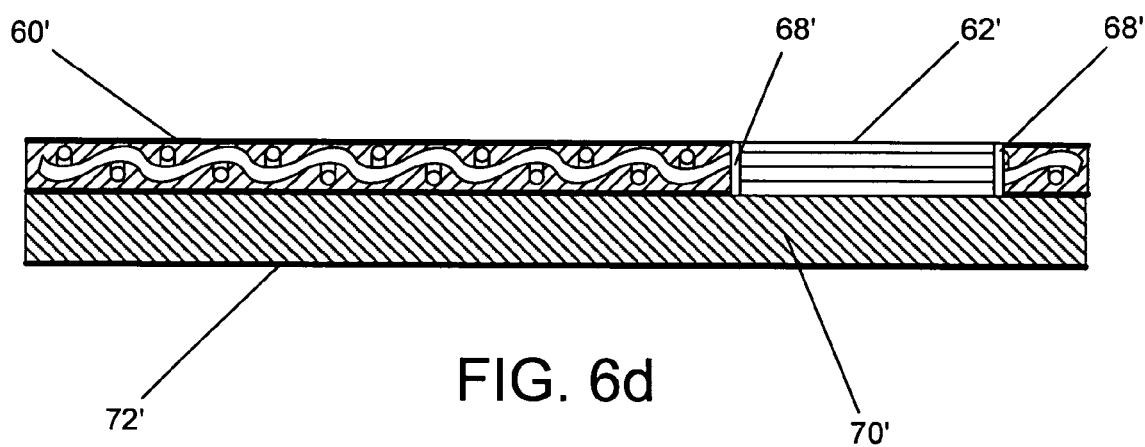
Figure 6E:
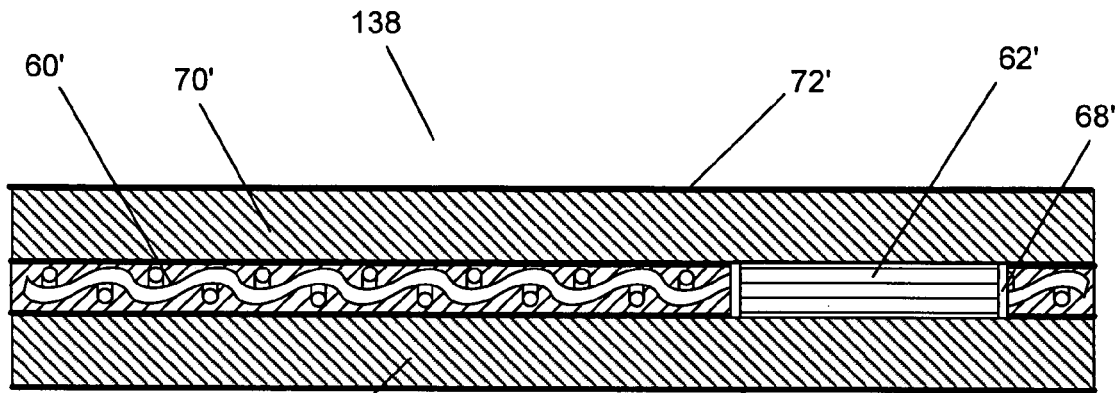

The arrangement of the base material, insert materials and layers including resin can be understood with reference to FIGS. 6c-6e. Initially a layer of prepreg 70' is stacked on a foil 72' (see FIG. 6c), then the base material 60' is placed on top of the prepreg and the insert materials 62' are placed in the cut out portions 66' of the base material. The arrangement is completed by placing a second prepreg 70' on top of the layer formed by the base material 60' and the insert materials 62' and then placing a second foil 72' on top of the second prepreg. The final arrangement 138 is illustrated in FIG. 6e. In other embodiments, prepregs clad on one side can be used.

Figure 6F:
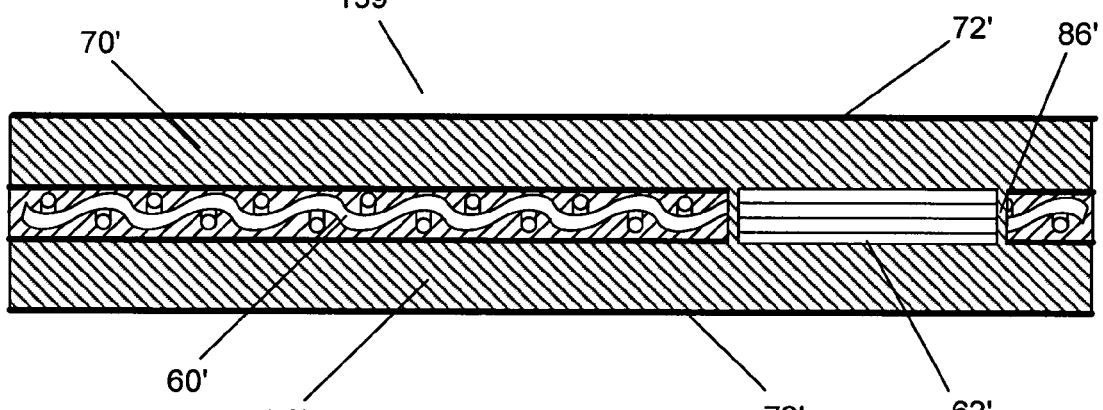

A first lamination cycle is performed (106) to produce the printed wiring board subassembly 139 shown in FIG. 6f. Typically, the lamination cycle is performed in accordance with the manufacturer's recommendations for the various materials used to form the arrangement 138. During the lamination, resin from the prepregs 70' flows to fill the gaps 68' between the base material 60' and the insert materials 62'. During the lamination, the resin softens, gels and cures thus bonding the base material 60' to the insert materials 62'. The resin also bonds the layer formed by the base material 60' and the insert materials 62' to the layers of electrically conductive material 72'.

Figure 6G:
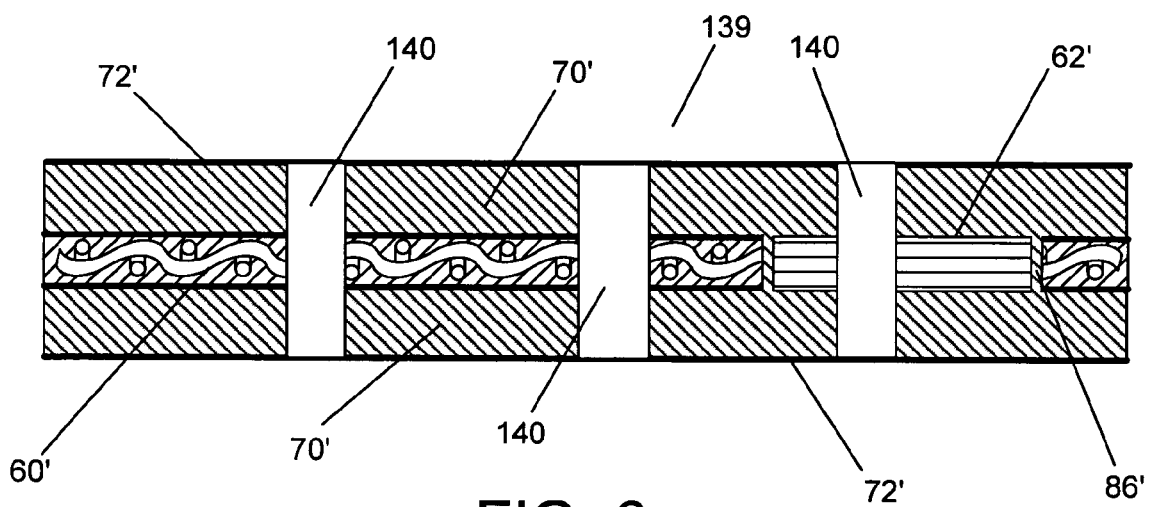
Figure 6H:
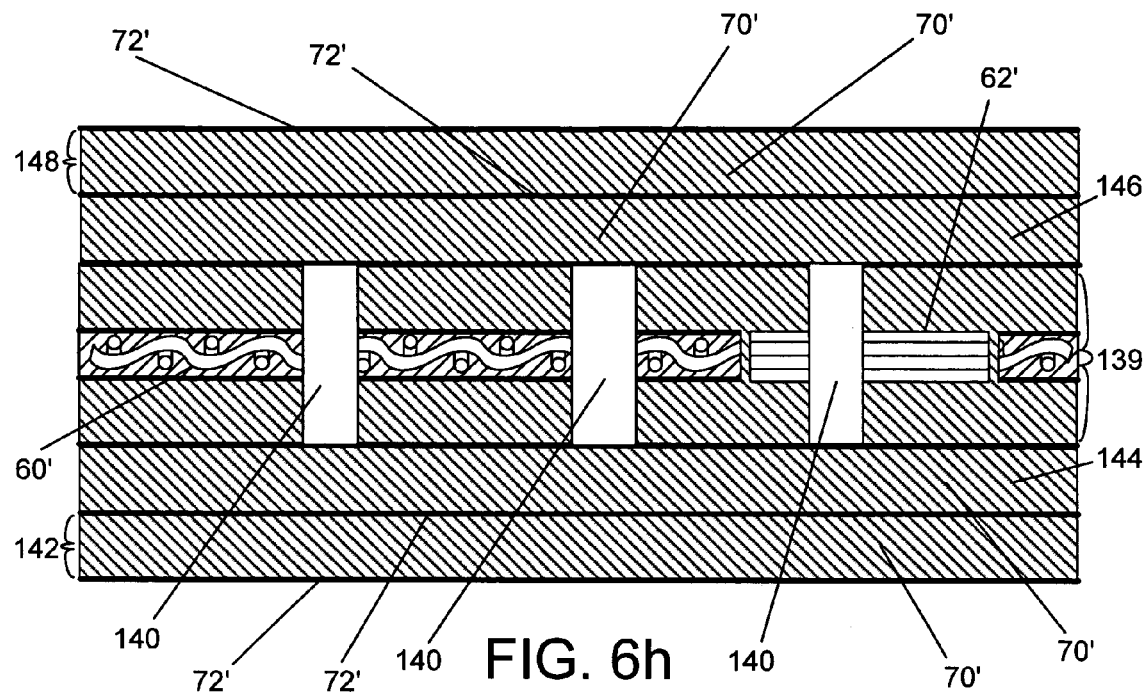

Following the lamination, clearance holes 140 can be drilled (108) in the printed wiring board subassembly 139. A printed wiring board subassembly in which clearance holes 140 have been drilled is illustrated in FIG. 6g. Ultimately, the clearance holes are filled with a dielectric material, such as a dielectric resin, and plated vias are drilled through the resin filled clearance holes. The dielectric material filling the clearance holes serve to electrically isolate the base material 60' and the insert materials 62' from the plated vias drilled through the clearance holes.

Following the clearance hole drilling, the layers of electrically conductive material are printed, etched and oxided (110) to create clearance pads and remove debris. The printed wiring board subassembly can then be arranged (112) with prepregs 70' and layers of electrically conductive material 72' in preparation for a second lamination cycle. In one embodiment, a stack is formed using a laminate 142 clad on both sides with layers of electrically conductive material and prepreg 144 located between the printed wiring board subassembly 139 and the laminate. The laminate 142 is etched with a circuit pattern on the layer of electrically conductive material that faces the prepreg 144. The stack can then be completed by adding another prepreg 146 and then another laminate 148 clad on both sides with layers of electrically conductive material. The laminate 148 is etched with circuit patterns on the layer of electrically conductive material that faces the prepreg 146. The construction of the clad laminates 142 and 148 and the prepregs 144 and 146 can be achieved using conventional manufacturing techniques. Although, the stack shown in FIG. 6h includes a prepreg and a clad laminate above and below a printed wiring board assembly, embodiments of the present invention can include a prepreg clad on one side above and below the printed wiring board assembly. Alternatively, embodiments of the present invention can include more than one prepreg and/or laminate. In many embodiments, multiple printed wiring board subassemblies can be combined in a single stack to create a printed wiring board. In addition, the printed wiring board subassembly can be used as a layer in the construction of a printed wiring board in accordance with the method shown in FIG. 3.

Figure 6I:
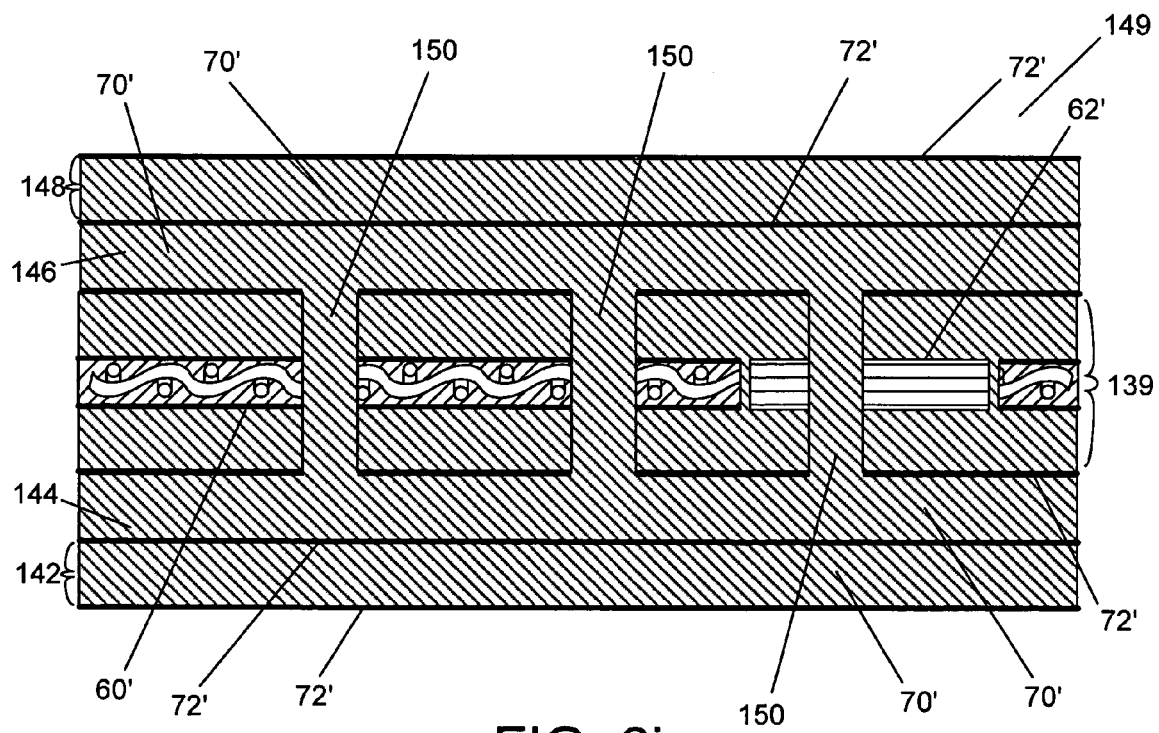

A second lamination cycle is performed (114) in order to produce a second printed wiring board subassembly 149 shown in FIG. 6i. Again, the nature of the lamination cycle performed is dependent upon the manufacturer's recommendations for the materials used in the construction of the printed wiring board. During the lamination, resin 150 from the prepregs 144 and 146 flows to fill the holes 140. Following the lamination, the resin in the prepregs 144 and 146 bonds the layers of the second printed wiring board subassembly together.

Figure 6J:
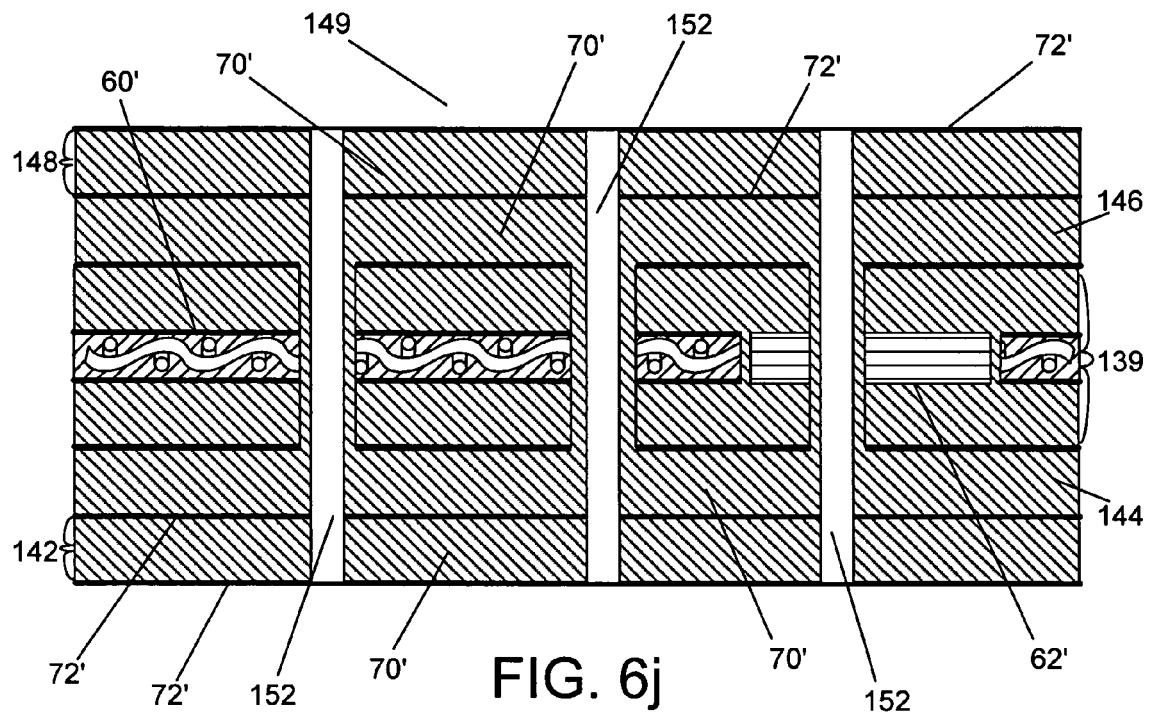
Figure 6K:
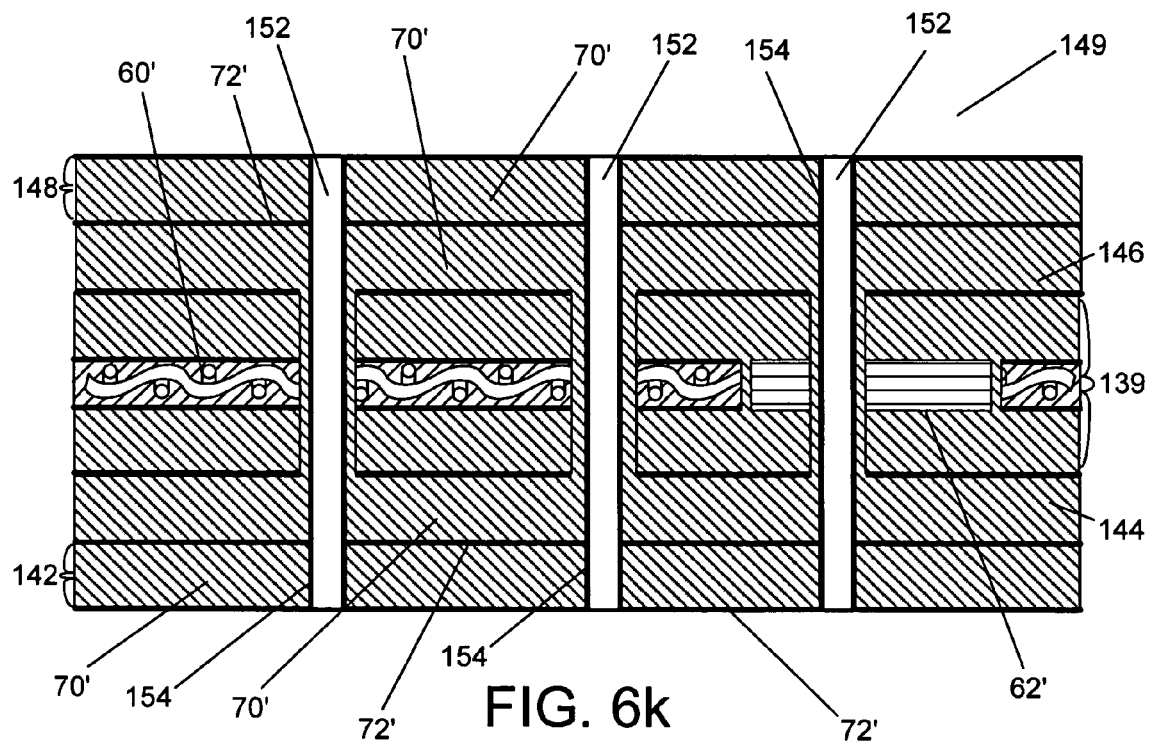

Once the second lamination cycle is complete, holes 152 can be drilled (116) in the second printed wiring board subassembly with a view to creating mounting holes and plated vias. An embodiment of a second printed wiring board subassembly 149 with holes 152 drilled through it is shown in FIG. 6j. The holes can then be lined (118) to create plated vias 154 as is shown in FIG. 6k. Following the lining of the holes, the external layers of the printed wiring board can be printed and etched (120) prior to the finishing (122) of the printed wiring board and the mounting of any components on the printed wiring board.

Figure 7:
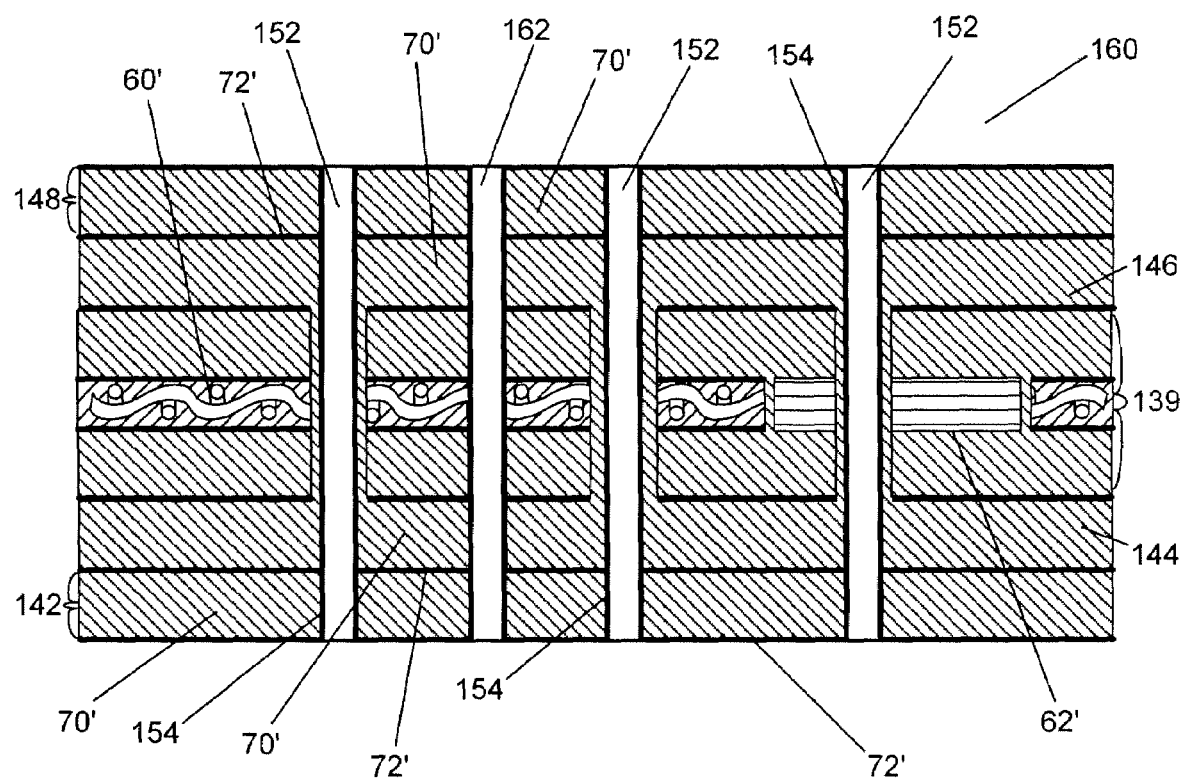
FIG. 7 is a schematic cross-sectional view of a printed wiring board in accordance with an embodiment of the present invention including plated through holes.

An embodiment of a printed wiring board 160 in accordance with the present invention that includes a base material that acts as a functional layer within the printed wiring board is shown in FIG. 7. The illustrated printed wiring board 160 can be constructed in accordance with the process illustrated in FIG. 5. Electrical connections are established between the base material and circuits patterned on other electrically conductive layers of the printed wiring board using plated through holes 162.

Although specific materials have been referred to above in the discussion of manufacturing printed wiring boards in accordance with the present invention, any material that can be used in the manufacture of a printed wiring board can be used as either the base material or as an insert material in the manufacture of printed wiring boards in accordance with the present invention. The combination of materials to form a printed wiring board in accordance with the present invention is largely dependent upon the glass transition temperatures of the materials. In embodiments where a C-stage material (i.e. a material that has already undergone glass transition) is used as the insert materials, then the base material can be a B-stage material (i.e. a material that is semi-cured) with a glass transition temperature that is equal to or lower than the glass transition temperature of the C-stage insert material. The same is also true when the base material is a C-stage material and an insert material is a B-stage material. In addition, similar care in the choice of the resin used to combine the base and insert materials should be used when the base and insert materials are C-stage materials. Once materials have been selected, the manufacturing method chosen depends upon whether any of the insert materials and/or the resin used to combine the base material and insert materials are non-dielectric. As discussed above, if the insert materials and the resin used to combine the base material and insert materials are dielectric then either the process shown in FIG. 3 or the process shown in FIG. 5 can be used to manufacture a printed wiring board. If one of the insert materials is electrically conductive and a plated via passes through that insert material, then the process shown in FIG. 5 is typically used.

Although the foregoing embodiments are disclosed as typical, it would be understood that additional variations, substitutions and modifications can be made to the system, as disclosed, without departing from the scope of the invention. For example, multiple layers similar to the layer 20 shown in FIG. 2 or 139 in FIG. 7 can be included in a single printed wiring board. Also combinations of base materials and insert materials can be used either as functional layers or as non-functional layers. In embodiments where the base materials and insert materials are used to form a functional layer, the functional layer can be used as a ground layer, a power layer or a split plane layer. In addition, any variety of dielectric and electrically conductive materials can be used as either the base material or as an insert material. Furthermore, the cut outs and inserts can be arbitrary shapes and multiple inserts can be located within a single cut out region of a base material. Accordingly, the scope of the invention should be determined not by the embodiments illustrated, but by the appended claims and their equivalents.

What is claimed is:

1. A printed wiring board comprising:
   a layer including a base material and at least one planar insert material that are combined using a resin;
   wherein the base material and planar insert material are located within the same plane;
   wherein the base material comprises the majority of the layer;
   wherein the composition of at least one of the planar insert materials is different to the composition of the base material and the resin; and
   wherein at least one of the insert materials includes fibers.

2. The printed wiring board of claim 1, wherein the layer formed by the base material and the at least one planar insert materials is clad on at least one side with a layer of electrically conductive material.

3. The printed wiring board of claim 1, wherein the base material is a dielectric material.

4. The printed wiring board of claim 3, wherein at least one of the planar insert materials is dielectric.

5. The printed wiring board of claim 3, wherein at least one of the planar insert materials is non-dielectric.

6. The printed wiring board of claim 5, wherein at least one plated through hole passes through the non-dielectric planar insert material.

7. The printed wiring board of claim 6, further comprising:
   a layer of electrically conductive material separated from the layer formed by the base material, at least one planar insert materials and resin by at least a dielectric layer;
   wherein at least one of the plated through holes establishes an electrical connection between the non-dielectric planar insert material and the layer of electrically conductive material.

8. The printed wiring board of claim 6, wherein at least one of the plated through holes passes through a dielectric filled clearance hole in the non-dielectric planar insert material.

9. The printed wiring board of claim 1, wherein the base material is non-dielectric.

10. The printed wiring board of claim 9, further comprising:
    a layer of electrically conductive material separated from the layer formed by the base material, at least one planar insert materials and resin by at least a dielectric layer; and
    at least one plated through hole; wherein a plated through hole establishes an electrical connection between the non-dielectric base material and the layer of electrically conductive material.

11. The printed wiring board of claim 9, wherein at least one of the planar insert materials is dielectric.

12. The printed wiring board of claim 9, wherein at least one of the planar insert materials is non-dielectric.

13. The printed wiring board of claim 12, further comprising at least one plated through hole that passes through the non-dielectric planar insert material.

14. The printed wiring board of claim 13, further comprising:
    a layer of electrically conductive material separated from the layer formed by the base material, at least one planar insert materials and resin by at least a dielectric layer;
    wherein at least one of the plated through holes establishes an electrical connection between the non-dielectric planar insert material and the layer of electrically conductive material.

15. The printed wiring board of claim 13, wherein at least one of the plated through holes passes through a dielectric filled clearance hole in the non-dielectric planar insert material.

16. The printed wiring board of claim 1, wherein the fibers are E-glass fibers.

17. The printed wiring board of claim 1, wherein the fibers are carbon fibers.

18. The printed wiring board of claim 1, wherein the fibers are Aramid fibers.

19. The printed wiring board of claim 1, wherein the fibers are woven fibers.

20. The printed wiring board of claim 1, wherein the fibers are non-woven fibers.

* * * * *